(12) United States Patent
Mishima et al.

(10) Patent No.: US 12,446,193 B2
(45) Date of Patent: Oct. 14, 2025

(54) HEAT-DISSIPATING STRUCTURE

(71) Applicant: OMRON Corporation, Kyoto (JP)

(72) Inventors: Junya Mishima, Kyoto (JP); Tomoyuki Hakata, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 295 days.

(21) Appl. No.: 18/022,383

(22) PCT Filed: Sep. 2, 2021

(86) PCT No.: PCT/JP2021/032317
§ 371 (c)(1),
(2) Date: Feb. 21, 2023

(87) PCT Pub. No.: WO2022/054691
PCT Pub. Date: Mar. 17, 2022

(65) Prior Publication Data
US 2024/0040749 A1 Feb. 1, 2024

(30) Foreign Application Priority Data

Sep. 11, 2020 (JP) ................. 2020-153167

(51) Int. Cl.
*H05K 7/20* (2006.01)
(52) U.S. Cl.
CPC ................. *H05K 7/2039* (2013.01)
(58) Field of Classification Search
CPC .............. H05K 7/2039; H05K 7/20509; H01L 23/3677; H01L 23/373; H01L 23/3735; H01L 23/3736; H01L 23/36
(Continued)

(56) References Cited

U.S. PATENT DOCUMENTS 7,038,310 B1 * 5/2006 Nakatani ........... H01L 23/49524
257/E23.033
2020/0118906 A1 4/2020 Cola et al.

FOREIGN PATENT DOCUMENTS

EP 2109138 A1 10/2009
JP 2018134779 A 8/2018
(Continued)

OTHER PUBLICATIONS

International Search Report for International Application No. PCT/JP2021/032317; Date of Mailing, Nov. 30, 2021.
(Continued)

*Primary Examiner* — Steve S Tanenbaum
(74) *Attorney, Agent, or Firm* — CANTOR COLBURN LLP

(57) ABSTRACT

A heat-dissipating structure includes a board configured to be attached to a heating element, a resin layer provided between the board and a heat dissipation member, the resin layer being attached to the board, and at least one heat transfer portion configured to transfer heat generated by the heating element to the heat dissipation member through the resin layer. The at least one heat transfer portion includes a heat transfer member, which is plate-shaped, provided between the board and the resin layer, the heat transfer member extending along the board, and a conductive layer provided between the board and the resin layer and across the board and the heat transfer member, the conductive layer being partially disposed between the heat transfer member and the resin layer.

8 Claims, 7 Drawing Sheets

(58) Field of Classification Search
USPC .......................................................... 165/80.2
See application file for complete search history.

(56) References Cited

FOREIGN PATENT DOCUMENTS

| | | |
|---|---|---|
| JP | 2020129605 A | 8/2020 |
| WO | 2008078788 A1 | 7/2008 |

OTHER PUBLICATIONS

PCT Written Opinion of the International Searching Authority for International Application No. PCT/JP2021/032317; Date of Mailing, Nov. 30, 2021.
EPO Extended European Search Report for corresponding EP Application No. 21866650.1; Issued Sep. 6, 2024.

\* cited by examiner

HEAT-DISSIPATING STRUCTURE

CROSS REFERENCE TO RELATED APPLICATIONS

This is the U.S. national stage of application No. PCT/JP2021/032317, filed on Sep. 2, 2021. Priority under 35 U.S.C. § 119 (a) and 35 U.S.C. § 365 (b) is claimed from Japanese Application No. 2020-153167, filed on Sep. 11, 2020, the disclosure of which is also incorporated herein by reference.

TECHNICAL FIELD

The present disclosure relates to a heat-dissipating structure.

BACKGROUND ART

Patent Document 1 discloses a heat-dissipating structure in which a heating element such as a semiconductor package and a heat dissipator such as a heat sink are brought into close contact with each other with interposition of a multilayer resin sheet and heat generated from the heating element is dissipated through the multilayer resin sheet.

PRIOR ART DOCUMENT

Patent Document

Patent Document 1: JP 2018-134779 A

SUMMARY OF THE INVENTION

Problems to be Solved by the Invention

In the heat-dissipating structure, for example, when a multilayer resin sheet is attached to a plate surface of a printed circuit board having the plate surface provided with a plurality of patterns having large irregularities and different potentials, a void may be formed between the printed circuit board and the multilayer resin sheet. When such voids are formed, insulation properties between the printed circuit board and the multilayer resin sheet may be deteriorated.

An object of the present disclosure is to provide a heat-dissipating structure having high insulation properties.

Solutions to the Problems

A heat-dissipating structure according to an aspect of the present disclosure is a heat-dissipating structure configured to dispose between a heating element and a heat dissipation member, the heat dissipation member being configured to dissipate heat generated by the heating element, the heat-dissipating structure including:
  a board configured to be attached to the heating element;
  a resin layer provided between the board and the heat dissipation member, the resin layer being attached to the board; and
  at least one heat transfer portion configured to transfer heat generated by the heating element to the heat dissipation member through the resin layer, wherein
  the at least one heat transfer portion includes:
    a heat transfer member, which is plate-shaped, provided between the board and the resin layer, the heat transfer member extending along the board, and
    a conductive layer provided between the board and the resin layer and across the board and the heat transfer member, the conductive layer being partially disposed between the heat transfer member and the resin layer.

Effects of the Invention

The heat-dissipating structure includes at least one heat transfer portion including a plate-shaped heat transfer member and a conductive layer. The heat transfer member is provided between the board and the resin layer and extending along the board. The conductive layer is provided between the board and the resin layer and across the board and the heat transfer member, and partially disposed between the heat transfer member and the resin layer. With this configuration, since the void formed by the board, the heat transfer member, and the resin layer can be covered with the conductive layer from the resin layer side, for example, when the heating element is an electronic component, occurrence of partial discharge caused by the void can be suppressed. As a result, a heat-dissipating structure having high insulation properties can be achieved.

DETAILED DESCRIPTION

Hereinafter, an example of the present disclosure will be described with reference to the accompanying drawings. It should be noted that in the following description, terms indicating specific directions or positions (for example, terms including "upper", "lower", "right", and "left") are used as necessary, but using these terms is to facilitate understanding of the present disclosure with reference to the drawings, and the technical scope of the present disclosure is not limited by the meaning of the terms. In addition, the following description is, essentially, merely illustrative and is not intended to limit the present disclosure, applied products thereof, or applications thereof. Furthermore, the drawings are schematic, and ratios and the like of the respective dimensions do not necessarily match those of actual ones.

Figure 1:
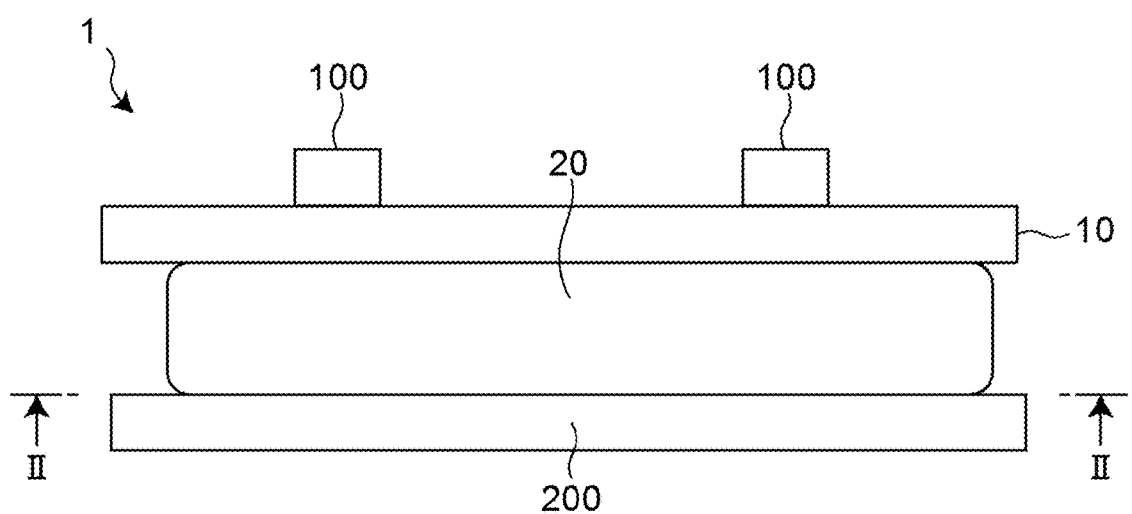
FIG. 1 is a side view showing a heat-dissipating structure according to an embodiment of the present disclosure.

As shown in FIG. 1, a heat-dissipating structure 1 according to an embodiment of the present disclosure is configured to dispose between a heating element 100 and a heat dissipation member 200, the heat dissipation member being configured to dissipate heat generated by the heating element 100. The heating element 100 includes, for example, an electronic component such as a semiconductor, and the heat dissipation member 200 includes, for example, a heat sink.

Figure 2:
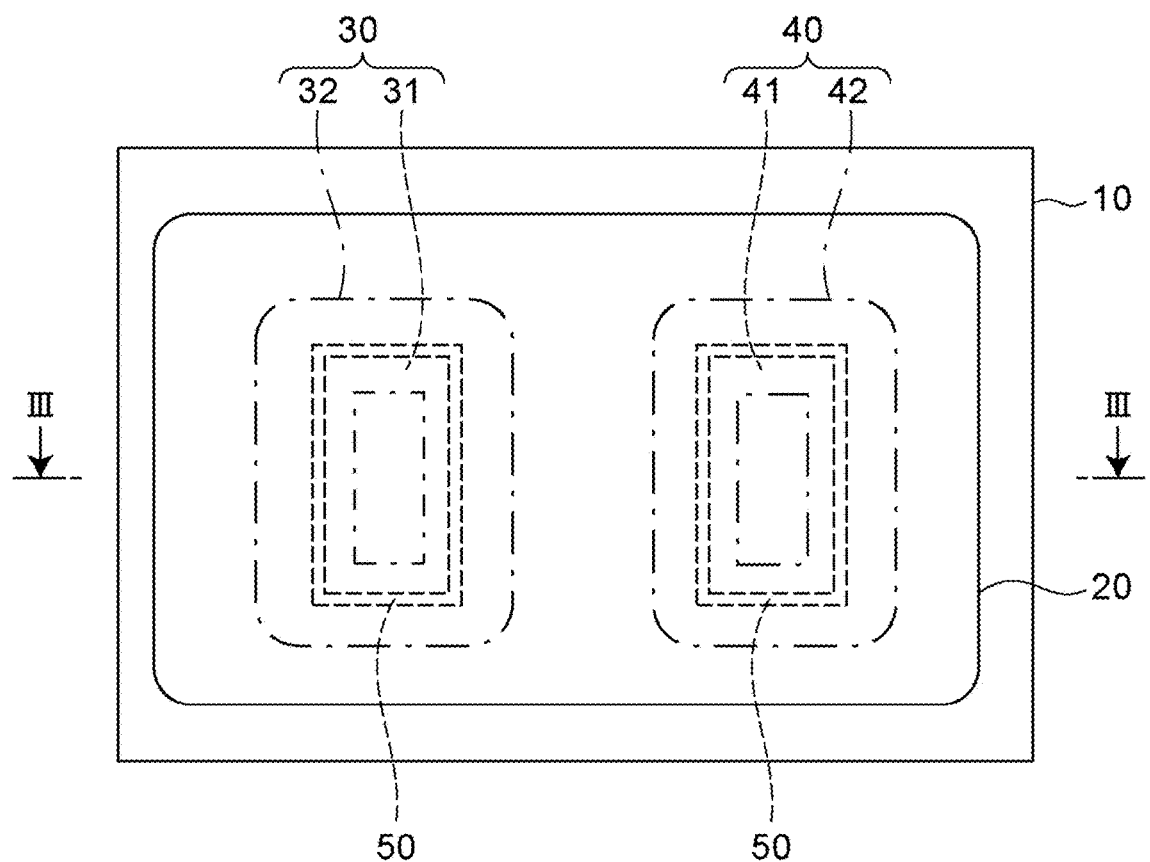
FIG. 2 is a cross-sectional view taken along line II-II in FIG. 1.
Figure 3:
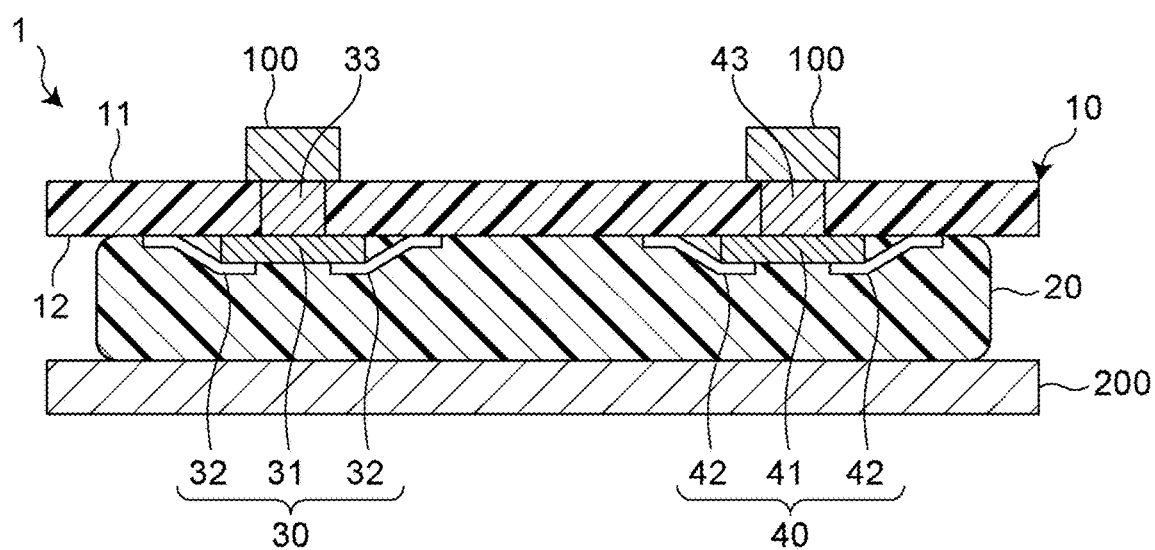
FIG. 3 is a cross-sectional view taken along line III-III in FIG. 2.

As shown in FIG. 1 to FIG. 3, the heat-dissipating structure 1 includes a board 10, a resin layer 20 attached to the board 10, and a heat transfer portion provided between the board 10 and the resin layer 20. The heat transfer portion is configured to transfer heat generated by the heating element 100 to the heat dissipation member 200 through the resin layer 20. In the present embodiment, two heating elements 100 are attached to the board 10, and the heat-dissipating structure 1 includes two heat transfer portions (hereinafter, referred to as a first heat transfer portion 30 and a second heat transfer portion 40) corresponding to the respective heating elements 100.

The board 10 is, for example, a printed circuit board including a copper foil and having a thickness of 50 μm or more and includes a first surface 11 to which the heating element 100 is attached and a second surface 12 disposed on an opposite side from the first surface 11 in a thickness direction of the board as shown in FIG. 3. The resin layer 20 is attached to the second surface 12.

The resin layer 20 is made of, for example, silicone containing an inorganic filler, and has a thickness of 400 μm or more. The resin layer 20 includes a first end and a second end in a thickness direction of the resin layer, the first end being attached to the heating element 100 and the second end being attached to the heat dissipation member 200.

The heat transfer portions 30, 40 include plate-shaped heat transfer members 31, 41 and conductive layers 32, 42, respectively.

The heat transfer member 31, 41 is, for example, made of copper and formed by etching. In the present embodiment, the heat transfer member 31, 41 has, for example, a substantially rectangular film shape having a thickness of 5 μm or less, is provided between the board 10 and the resin layer 20 and extends along the second surface 12 of the board 10 as shown in FIG. 3. The heat transfer member 31, 41 is connected to the heating elements 100 through the heat transfer layer 33, 43 extending through the board 10 in the thickness direction.

The conductive layer 32, 42 is made of, for example, copper, silver, or graphite, and is formed by plating, sputtering, or lamination. In the present embodiment, the conductive layer 32, 42 has a thickness of 5 μm or less, and as shown in FIG. 3, is provided between the board 10 and the resin layer 20 and across the board 10 and the heat transfer member 31, 41, and partially disposed between the heat transfer member 31, 41 and the resin layer 20. As shown in FIG. 2, the conductive layer 32, 42 is disposed to cover an entire peripheral edge of the heat transfer member 31, 41, and covers an entire void 50 formed by the board 10, the heat transfer member 31, and the resin layer 20 from the resin layer 20 side.

Here, regarding the heat-dissipating structure 1 of the present embodiment, influence of the thicknesses and elastic moduli of the conductive layer 32, 42 and the resin layer 20 on adhesion between the conductive layer 32, 42 and board 10 and between the resin layer 20 and board 10 was examined. Specifically, regarding a plurality of heat-dissipating structures 1 including the conductive layer 32, 42 having a thickness of 5 μm and an elastic modulus of 16 Gpa and the resin layer 20 having a different thickness and elastic modulus, in a state where the resin layer 20 was pressed toward the board 10 until the thickness thereof reached 70%, whether the conductive layer 32, 42 and resin layer 20 and the board 10 were in contact with each other or not was measured.

Figure 4:
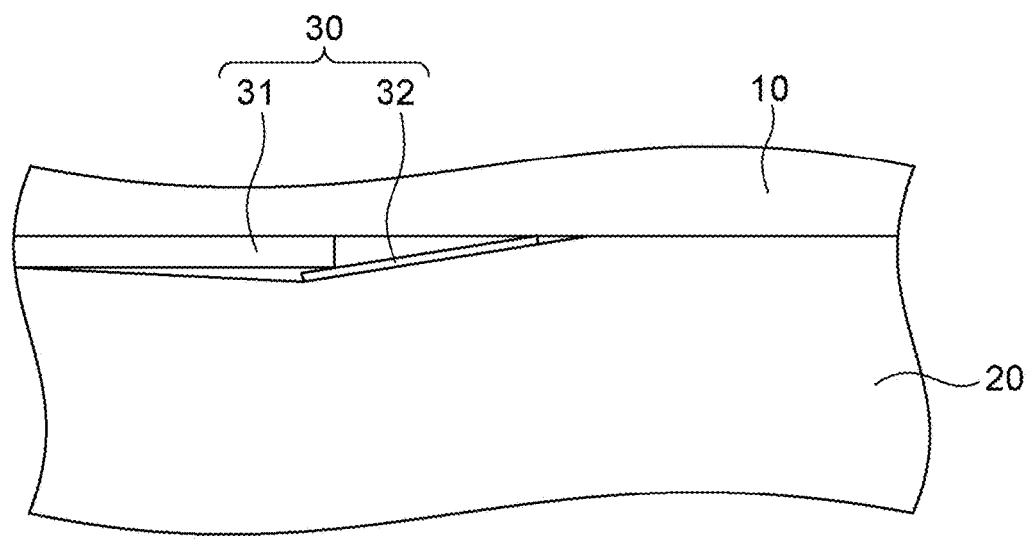
FIG. 4 is a first view for illustrating the influence of the thicknesses and the elastic moduli of the conductive layer and the resin layer on the relationship with the adhesion between the conductive layer and resin layer and the board.

FIG. 4 shows the heat-dissipating structure 1 when the ratio of the elastic modulus of the resin layer 20 to the elastic modulus of the conductive layer 32, 42 is 1/100,000, and the ratio of the thickness of the resin layer 20 to the thickness of the conductive layer 32, 42 is 160. In the heat-dissipating structure 1 in FIG. 4, the conductive layer 32, 42 and resin layer 20 and the board 10 were in contact with each other in many portions, and high adhesion was obtained.

Figure 5:
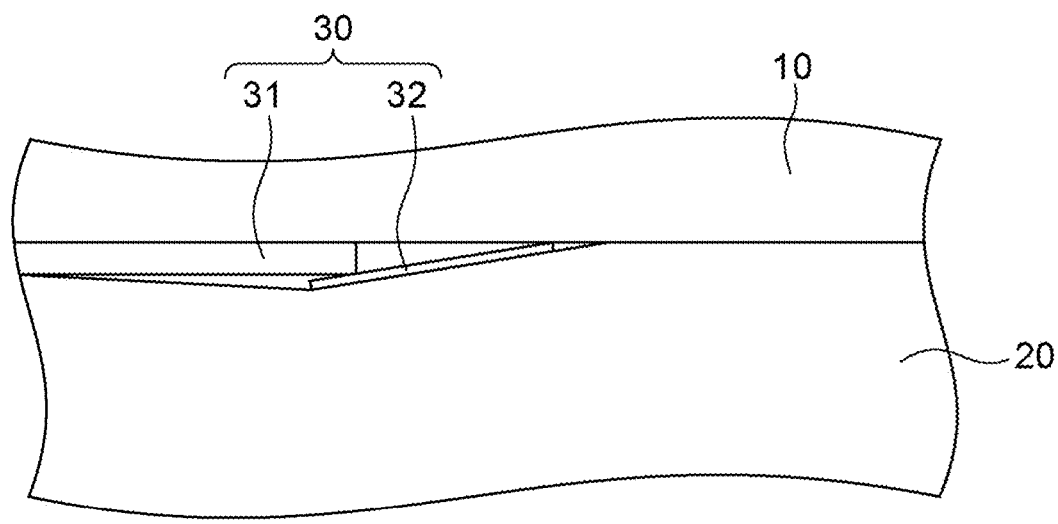
FIG. 5 is a second view for illustrating the influence of the thicknesses and the elastic moduli of the conductive layer and the resin layer on the relationship with the adhesion between the conductive layer and resin layer and the board.

FIG. 5 shows the heat-dissipating structure 1 when a ratio of the elastic modulus of the resin layer 20 to the elastic modulus of the conductive layer 32, 42 is 1/100,000, and a ratio of the thickness of the resin layer 20 to the thickness of the conductive layer 32, 42 is 80. In the heat-dissipating structure 1 in FIG. 5, the conductive layer 32, 42 and resin layer 20 and the board 10 were in contact with each other in many portions, and high adhesion was obtained.

Figure 6:
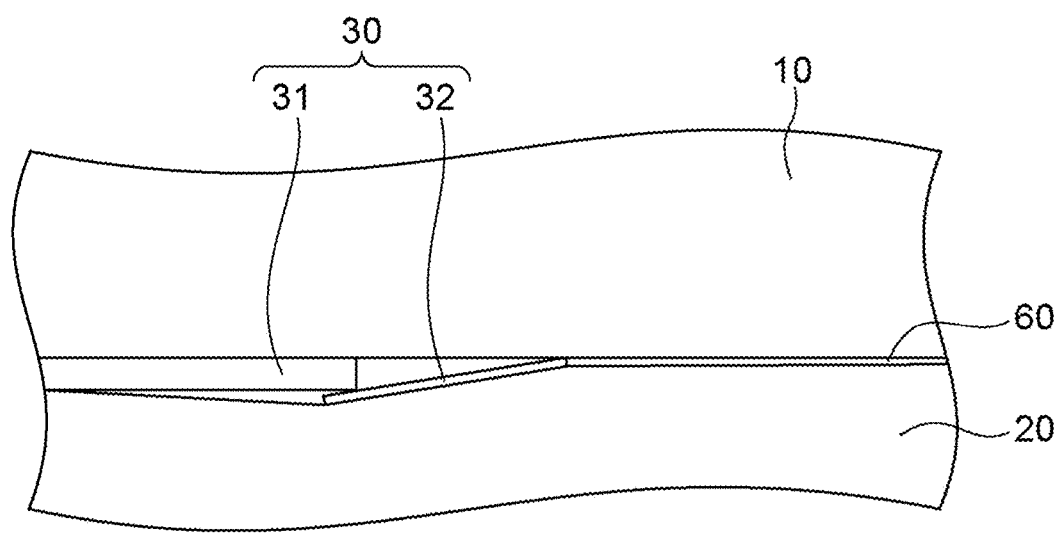
FIG. 6 is a third view for illustrating the influence of the thicknesses and the elastic moduli of the conductive layer and the resin layer on the relationship with the adhesion between the conductive layer and resin layer and the board.

FIG. 6 shows the heat-dissipating structure 1 when a ratio of the elastic modulus of the resin layer 20 to the elastic modulus of the conductive layer 32, 42 is 1/100,000, and a ratio of the thickness of the resin layer 20 to the thickness of the conductive layer 32, 42 is 40. In the heat-dissipating structure 1 in FIG. 5, the conductive layer 32, 42 and the board 10 were in contact with each other in many portions to secure sufficient adhesion, but a gap 60 was formed in many portions between the resin layer 20 and the board 10, and sufficiently high adhesion was not obtained.

Figure 7:
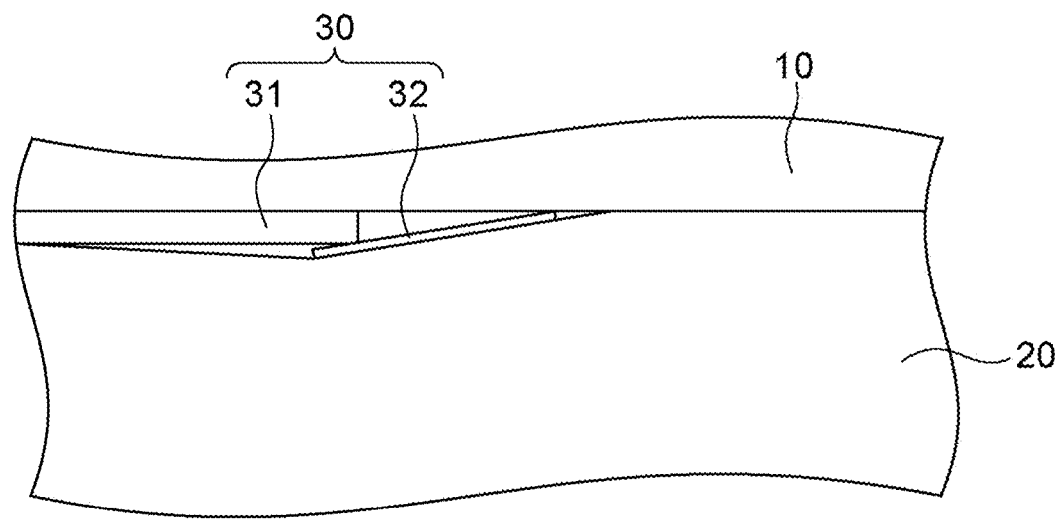
FIG. 7 is a fourth view for illustrating the influence of the thicknesses and the elastic moduli of the conductive layer and the resin layer on the relationship with the adhesion between the conductive layer and resin layer and the board.

FIG. 7 shows the heat-dissipating structure 1 when a ratio of the elastic modulus of the resin layer 20 to the elastic modulus of the conductive layer 32, 42 is 1/10,000, and a ratio of the thickness of the resin layer 20 to the thickness of the conductive layer 32, 42 is 160. In the heat-dissipating structure 1 in FIG. 7, the conductive layer 32, 42 and resin layer 20 and the board 10 were in contact with each other in many portions, and high adhesion was obtained.

Figure 8:
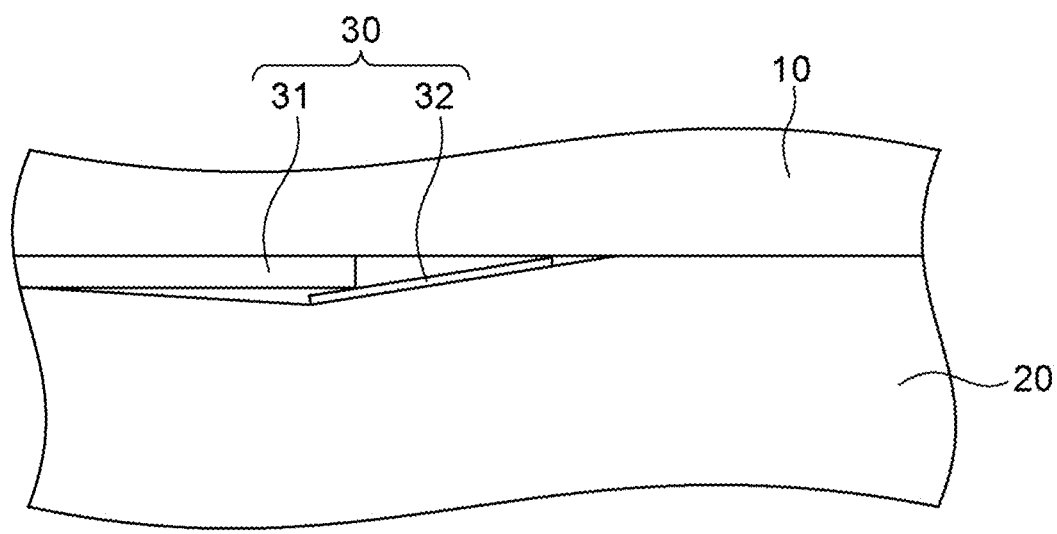
FIG. 8 is a fifth view for illustrating the influence of the thicknesses and the elastic moduli of the conductive layer and the resin layer on the relationship with the adhesion between the conductive layer and resin layer and the board.

FIG. 8 shows the heat-dissipating structure 1 when a ratio of the elastic modulus of the resin layer 20 to the elastic modulus of the conductive layer 32, 42 is 1/10,000, and a ratio of the thickness of the resin layer 20 to the thickness of the conductive layer 32, 42 is 80. In the heat-dissipating structure 1 in FIG. 8, the conductive layer 32, 42 and resin layer 20 and the board 10 were in contact with each other in many portions, and high adhesion was obtained.

Figure 9:
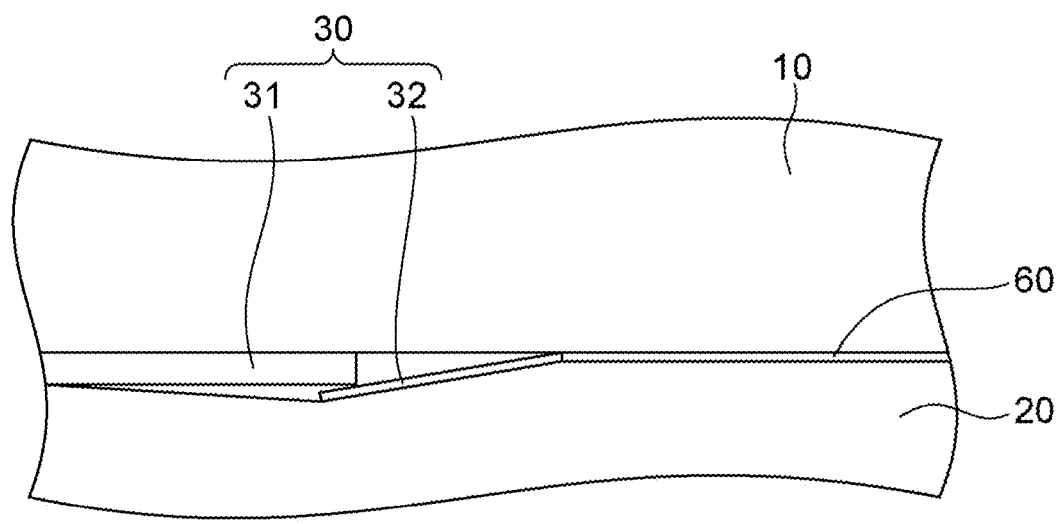
FIG. 9 is a sixth view for illustrating the influence of the thicknesses and the elastic moduli of the conductive layer and the resin layer on the relationship with the adhesion between the conductive layer and resin layer and the board.

FIG. 9 shows the heat-dissipating structure 1 when a ratio of the elastic modulus of the resin layer 20 to the elastic modulus of the conductive layer 32, 42 is 1/10,000, and a ratio of the thickness of the resin layer 20 to the thickness of the conductive layer 32, 42 is 40. In the heat-dissipating structure 1 in FIG. 9, the conductive layer 32, 42 and the board 10 were in contact with each other in many portions to secure sufficient adhesion, but a gap 60 was formed in many portions between the resin layer 20 and the board 10, and high adhesion was not obtained.

Figure 10:
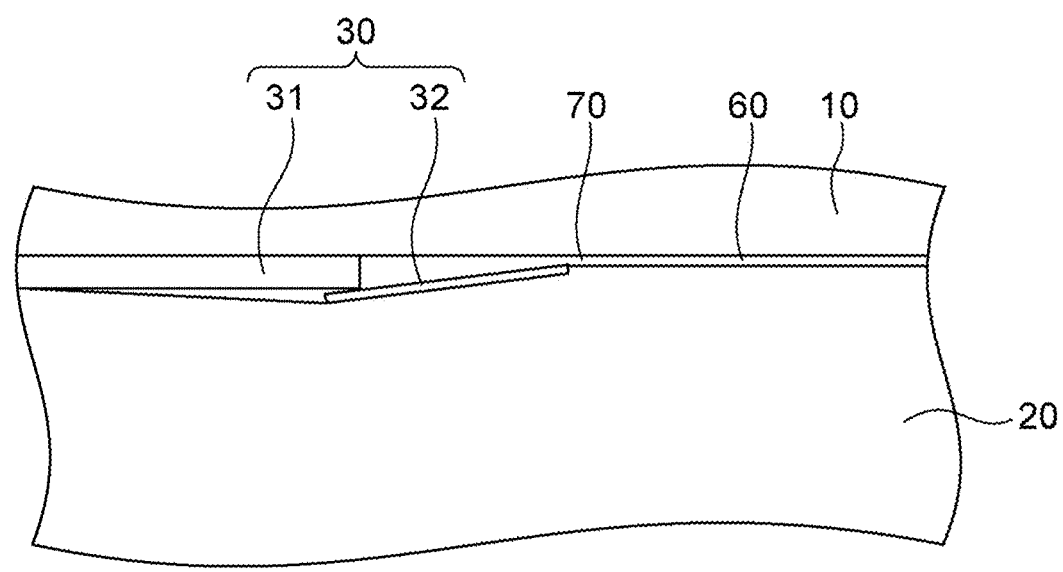
FIG. 10 is a seventh view for illustrating the influence of the thicknesses and the elastic moduli of the conductive layer and the resin layer on the relationship with the adhesion between the conductive layer and resin layer and the board.

FIG. 10 shows the heat-dissipating structure 1 when a ratio of the elastic modulus of the resin layer 20 to the elastic modulus of the conductive layer 32, 42 is 1/1,000, and a ratio of the thickness of the resin layer 20 to the thickness of the conductive layer 32, 42 is 160. In the heat-dissipating structure 1 in FIG. 10, a gap 60 was formed in many portions between the resin layer 20 and the board 10, and a gap 70 was formed between the conductive layer 32, 42 and the board 10, and sufficiently high adhesion was not obtained.

Figure 11:
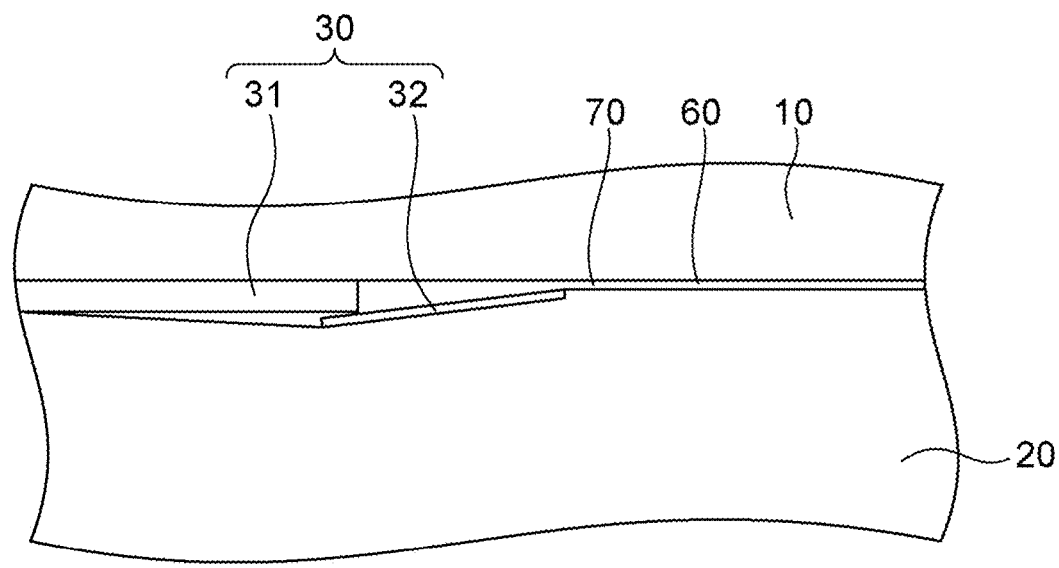
FIG. 11 is an eighth view for illustrating the influence of the thicknesses and the elastic moduli of the conductive layer and the resin layer on the relationship with the adhesion between the conductive layer and resin layer and the board.

FIG. 11 shows the heat-dissipating structure 1 when a ratio of the elastic modulus of the resin layer 20 to the elastic modulus of the conductive layer 32, 42 is 1/1,000, and a ratio of the thickness of the resin layer 20 to the thickness of the conductive layer 32, 42 is 80. In the heat-dissipating structure 1 in FIG. 11, a gap 60 was formed in many portions between the resin layer 20 and the board 10, and a gap 70 was formed between the conductive layer 32, 42 and the board 10, and sufficiently high adhesion was not obtained.

Figure 12:
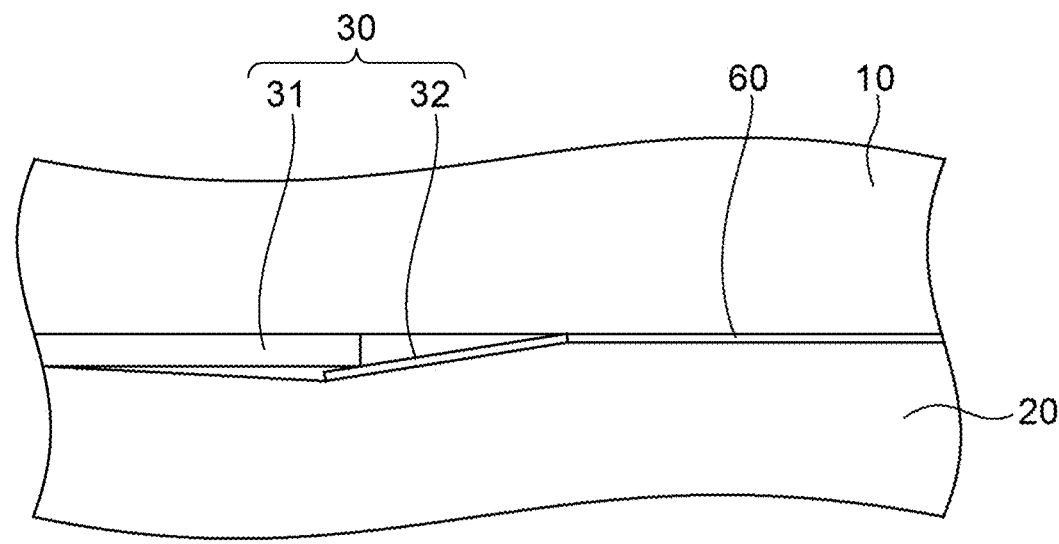
FIG. 12 is a ninth view for illustrating the influence of the thicknesses and the elastic moduli of the conductive layer and the resin layer on the relationship with the adhesion between the conductive layer and resin layer and the board.

FIG. 12 shows the heat-dissipating structure 1 when a ratio of the elastic modulus of the resin layer 20 to the elastic modulus of the conductive layer 32, 42 is 1/1,000, and a ratio of the thickness of the resin layer 20 to the thickness of the conductive layer 32, 42 is 40. In the heat-dissipating structure 1 in FIG. 12, the conductive layer 32, 42 and the board 10 were in contact with each other in many portions to secure sufficient adhesion, but a gap 60 was formed in many portions between the resin layer 20 and the board 10, and high adhesion was not obtained.

From the above investigation results, it has been found that by configuring the heat-dissipating structure 1 so that a ratio of the elastic modulus of the resin layer 20 to the elastic modulus of the conductive layer 32, 42 is 1/10,000 or less, and a ratio of the thickness of the resin layer 20 to the thickness of the conductive layer 32, 42 is 80 or more, adhesion of the conductive layer 32, 42 and the resin layer 20 to the board 10 can be enhanced.

According to the heat-dissipating structure 1, the following effects can be exerted.

The heat-dissipating structure 1 includes a heat transfer portion 30 including: a plate-shaped heat transfer member 31, 41 and a conductive layer 32, 42. The heat transfer member 31, 41 is provided between the board 10 and the resin layer 20 and extending along the board 10. The conductive layer 32, 42 is provided between the board 10 and the resin layer 20 and across the board 10 and the heat transfer member 31, 41, the conductive layer 32, 42 being partially disposed between the heat transfer member 31, 41 and the resin layer 20. With this configuration, since a void 50 formed by the board 10, the heat transfer member 31, 41, and the resin layer 20 can be covered with the conductive layer 32, 42 from the resin layer 20 side, for example, when the heating element 100 is an electronic component, occurrence of partial discharge caused by the void 50 can be suppressed. As a result, a heat-dissipating structure 1 having high insulation properties can be achieved.

A ratio of the elastic modulus of the resin layer 20 to the elastic modulus of the conductive layer 32, 42 is 1/10,000 or less, and a ratio of the thickness of the resin layer 20 to the thickness of the conductive layer 32, 42 is 80 or more. With this configuration, adhesion of the conductive layer 32, 42 and the resin layer 20 to the board 10 can be enhanced. As a result, for example, when the heating element 100 is an electronic component, occurrence of partial discharge caused by the void 50 is suppressed, and a heat-dissipating structure 1 with high insulation properties can be achieved.

The conductive layer 32, 42 is configured to cover the entire void 50, that is, to cover an entire peripheral edge of the heat transfer member 31, 41. With this configuration, for example, when the heating element 100 is an electronic component, occurrence of partial discharge caused by the void 50 can be more reliably suppressed.

According to the heat-dissipating structure 1, following configuration can also be made.

The number of heat transfer portions may be one, or three or more.

Each of the conductive layer 32, 42 and the resin layer 20 may be configured so that a ratio of the elastic modulus of the resin layer 20 to the elastic modulus of the conductive layer 32, 42 is larger than 1/10,000, or each of the conductive layer 32, 42 and the resin layer 20 may be configured so that a ratio of the thickness of the resin layer 20 to the thickness of the conductive layer 32, 42 is less than 80.

Figure 13:
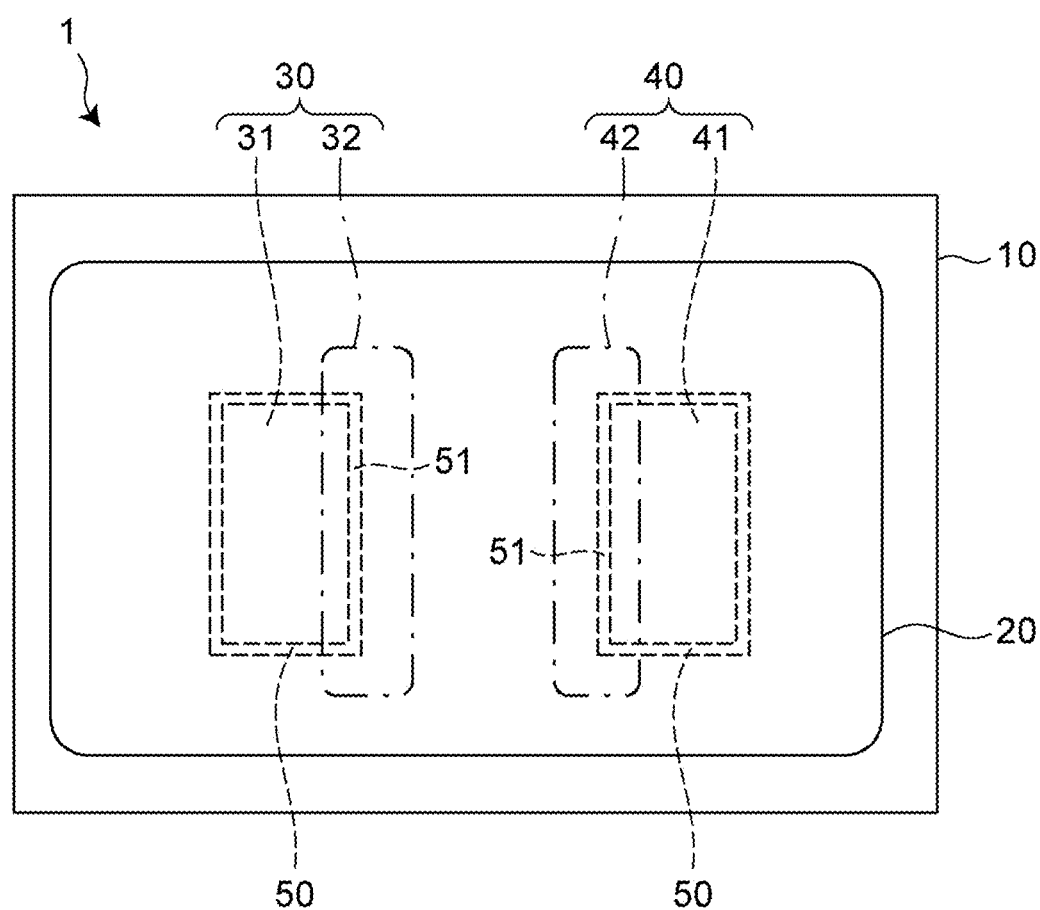
FIG. 13 is a cross-sectional view showing a modification of the heat-dissipating structure in FIG. 1.

The conductive layer 32, 42 is not limited to the case of being configured to cover the entire peripheral edge of the heat transfer member 31, 41, and may be configured to cover a part of the peripheral edge of the heat transfer member 31, 41 as shown in FIG. 13. In the heat-dissipating structure 1 in FIG. 13, the conductive layer 32 of the first heat transfer portion 30 is disposed to cover a peripheral edge of the heat transfer member 31 of the first heat transfer portion 30 closest to the heat transfer member 41 of the second heat transfer portion 40 in the direction along the board 10. As described above, by disposing the respective conductive layers 32, 42 to cover voids 51 closest to each other in the direction along the board 10, occurrence of partial discharge caused by the voids 50 can be more reliably suppressed.

That is, the heat-dissipating structure 1 can adopt any configuration capable of covering the void 50 with the conductive layer 32, 42.

As described above, various embodiments in the present disclosure have been described in detail with reference to the drawings. Lastly, various aspects of the present disclosure will be described. It should be noted that in the following description, as an example, reference numerals are also added.

A heat-dissipating structure 1 according to a first aspect of the present disclosure is a heat-dissipating structure 1 configured to dispose between a heating element 100 and a heat dissipation member 200, the heat dissipation member being configured to dissipate heat generated by the heating element 100, the heat-dissipating structure 1 including:

a board 10 configured to be attached to the heating element 100;

a resin layer 20 provided between the board 10 and the heat dissipation member 200, the resin layer 20 being attached to the board 10; and at least one heat transfer portion 30, 40 configured to transfer heat generated by the heating element 100 to the heat dissipation member 200 through the resin layer 20, wherein the at least one heat transfer portion 30, 40 includes:
- a heat transfer member 31, 41, which is plate-shaped, provided between the board 10 and the resin layer 20, the heat transfer member 31, 41 extending along the board 10, and
- a conductive layer 32, 42 provided between the board 10 and the resin layer 20 and across the board 10 and the heat transfer member 31, 41, the conductive layer 32, 42 being partially disposed between the heat transfer member 31, 41 and the resin layer 20.

In the heat-dissipating structure 1 according to a second aspect of the present disclosure, a ratio of an elastic modulus of the resin layer 20 to an elastic modulus of the conductive layer 32, 42 is 1/10,000 or less, and a ratio of a thickness of the resin layer 20 to a thickness of the conductive layer 32, 42 is 80 or more.

In the heat-dissipating structure 1 according to a third aspect of the present disclosure, the conductive layer 32, 42 is configured to cover an entire peripheral edge of the heat transfer member 31, 41.

In the heat-dissipating structure 1 according to a fourth aspect of the present disclosure, the at least one heat transfer portion includes a first heat transfer portion 30 and a second heat transfer portion 40, and the conductive layer 32 of the first heat transfer portion 30 is disposed to cover a peripheral edge of the heat transfer member 31 of the first heat transfer portion 30 closest to the heat transfer member 41 of the second heat transfer portion 40 in a direction along the board 10.

Appropriately combining any embodiment or modification out of the various embodiments or modifications allows the effect of each of the embodiment or modification to be exhibited. In addition, a combination of embodiments, a combination of examples, or a combination of an embodiment and an example is possible, and a combination of features of different embodiments or examples is also possible.

The present disclosure has been sufficiently described in connection with the preferred embodiments with reference to the accompanying drawings, and various modifications and corrections are apparent for those skilled in the art. It should be understood that as long as such modifications and corrections do not depart from the scope of the present disclosure by the attached claims, they are included therein.

INDUSTRIAL APPLICABILITY

The heat-dissipating structure of the present disclosure can be applied to, for example, a power conditioner.

REFERENCE SIGNS LIST

1 heat-dissipating structure
10 board
11 first surface
12 second surface
20 resin layer
40 heat transfer portion
31, 41 heat transfer member
32, 42 conductive layer
33, 43 heat transfer layer
50 void
70 gap
100 heating element
200 heat dissipation member

The invention claimed is:

1. A heat-dissipating structure configured to dispose between a heating element and a heat dissipation member, the heat dissipation member being configured to dissipate heat generated by the heating element, the heat-dissipating structure comprising:
    a board configured to be attached to the heating element;
    a resin layer provided between the board and the heat dissipation member, the resin layer being attached to the board; and
    at least one heat transfer portion configured to transfer heat generated by the heating element to the heat dissipation member through the resin layer, wherein
    the at least one heat transfer portion includes:
        a heat transfer member, which is plate-shaped, provided between the board and the resin layer, the heat transfer member extending along the board, and
        a conductive layer provided between the board and the resin layer and across the board and the heat transfer member, the conductive layer being partially disposed between the heat transfer member and the resin layer.

2. The heat-dissipating structure according to claim 1, wherein
    the at least one heat transfer portion includes a first heat transfer portion and a second heat transfer portion, and
    the conductive layer of the first heat transfer portion is disposed to cover a peripheral edge of the heat transfer member of the first heat transfer portion closest to the heat transfer member of the second heat transfer portion in a direction along the board.

3. The heat-dissipating structure according to claim 1, wherein
    the conductive layer is configured to cover an entire peripheral edge of the heat transfer member.

4. The heat-dissipating structure according to claim 3, wherein
    the at least one heat transfer portion includes a first heat transfer portion and a second heat transfer portion, and
    the conductive layer of the first heat transfer portion is disposed to cover a peripheral edge of the heat transfer member of the first heat transfer portion closest to the heat transfer member of the second heat transfer portion in a direction along the board.

5. The heat-dissipating structure according to claim 1, wherein
    a ratio of an elastic modulus of the resin layer to an elastic modulus of the conductive layer is 1/10,000 or less, and a ratio of a thickness of the resin layer to a thickness of the conductive layer is 80 or more.

6. The heat-dissipating structure according to claim 5, wherein
    the at least one heat transfer portion includes a first heat transfer portion and a second heat transfer portion, and
    the conductive layer of the first heat transfer portion is disposed to cover a peripheral edge of the heat transfer member of the first heat transfer portion closest to the heat transfer member of the second heat transfer portion in a direction along the board.

7. The heat-dissipating structure according to claim 5, wherein
    the conductive layer is configured to cover an entire peripheral edge of the heat transfer member.

8. The heat-dissipating structure according to claim 7, wherein
   the at least one heat transfer portion includes a first heat transfer portion and a second heat transfer portion, and
   the conductive layer of the first heat transfer portion is disposed to cover a peripheral edge of the heat transfer member of the first heat transfer portion closest to the heat transfer member of the second heat transfer portion in a direction along the board.

* * * * *